United States Patent
Baukus et al.

(10) Patent No.: US 6,919,600 B2
(45) Date of Patent: Jul. 19, 2005

(54) PERMANENTLY ON TRANSISTOR IMPLEMENTED USING A DOUBLE POLYSILICON LAYER CMOS PROCESS WITH BURIED CONTACT

(75) Inventors: James P. Baukus, Westlake Village, CA (US); Lap-Wai Chow, South Pasadena, CA (US); William M. Clark, Jr., Camarillo, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 10/789,261

(22) Filed: Feb. 26, 2004

(65) Prior Publication Data

US 2004/0164361 A1 Aug. 26, 2004

Related U.S. Application Data

(62) Division of application No. 09/882,892, filed on Jun. 15, 2001, now Pat. No. 6,740,942.

(51) Int. Cl.⁷ .................. H01L 21/8238; H01L 29/76
(52) U.S. Cl. .................. 257/341; 257/406; 257/389; 257/402; 257/404; 438/217; 438/289; 438/216; 438/288
(58) Field of Search .................. 257/406, 389, 257/402, 404; 438/217, 289, 216, 288

(56) References Cited

U.S. PATENT DOCUMENTS

| | | | |
|---|---|---|---|
| 3,673,471 A | 6/1972 | Klein et al. | 317/235 R |
| 3,946,426 A | 3/1976 | Sanders | 357/71 |
| 4,017,888 A | 4/1977 | Christie et al. | 357/54 |
| 4,101,344 A | 7/1978 | Kooi et al. | 148/1.5 |
| 4,139,864 A | 2/1979 | Schulman | 358/188 |
| 4,164,461 A | 8/1979 | Schilling | 204/192 EC |
| 4,196,443 A | 4/1980 | Dingwall | 357/68 |
| 4,267,578 A | 5/1981 | Vetter | 364/709 |
| 4,291,391 A | 9/1981 | Chatterjee et al. | 365/184 |
| 4,295,897 A | 10/1981 | Tubbs et al. | 148/1.5 |

(Continued)

FOREIGN PATENT DOCUMENTS

| EP | 0 186 855 A2 | 7/1986 |
|---|---|---|
| EP | 0 364 769 | 4/1990 |

(Continued)

OTHER PUBLICATIONS

U.S. Appl. No. 10/828,022, filed Apr. 19, 2004, Chow et al.
U.S. Appl. No. 10/881,286, filed Jun. 29, 2004, Chow et al.
U.S. Appl. No. 09/696,826, filed Oct. 25, 2000, Baukus et al.
U.S. Appl. No. 09/758,792, filed Jan. 1, 2001.

(Continued)

*Primary Examiner*—Allan R. Wilson
*Assistant Examiner*—Joseph Nguyen
(74) *Attorney, Agent, or Firm*—Ladas & Parry LLP

(57) ABSTRACT

A permanently-ON MOS transistor comprises silicon source and drain regions of a first conductivity type in a silicon well region of a second conductivity type. A silicon contact region of the first conductivity types is buried in the well region, said contact region contacting said source region and said drain region. A first gate insulating layer is selectively placed over the silicon source and drain regions. A second gate insulating layer is selectively placed over the first gate insulating layer and over the silicon contact region. A polysilicon gate region is placed over the second gate insulating layer.

6 Claims, 3 Drawing Sheets

U.S. PATENT DOCUMENTS

| | | |
|---|---|---|
| 4,314,268 A | 2/1982 | Yoshioka et al. ............. 357/48 |
| 4,317,273 A | 3/1982 | Guterman et al. ............ 29/571 |
| 4,322,736 A | 3/1982 | Sasaki et al. ................. 357/59 |
| 4,374,454 A | 2/1983 | Jochems ..................... 29/571 |
| 4,409,434 A | 10/1983 | Basset et al. ............... 380/265 |
| 4,435,895 A | 3/1984 | Parillo ........................ 29/571 |
| 4,471,376 A | 9/1984 | Morcom et al. ............. 357/71 |
| 4,530,150 A | 7/1985 | Shirato ..................... 29/576 B |
| 4,581,628 A | 4/1986 | Miyauchi et al. ............ 357/71 |
| 4,583,011 A | 4/1986 | Pechar ....................... 307/440 |
| 4,603,381 A | 7/1986 | Guttag et al. ............... 364/200 |
| 4,623,255 A | 11/1986 | Suszko ....................... 356/389 |
| 4,727,493 A | 2/1988 | Taylor, Sr. .................. 364/490 |
| 4,766,516 A | 8/1988 | Ozdemir et al. ............ 361/380 |
| 4,799,096 A | 1/1989 | Koeppe ....................... 357/42 |
| 4,821,085 A | 4/1989 | Haken et al. ................ 357/67 |
| 4,830,974 A | 5/1989 | Chang et al. ................ 437/34 |
| 4,939,567 A | 7/1990 | Kenney ..................... 257/383 |
| 4,962,484 A | 10/1990 | Takeshima et al. ......... 365/226 |
| 4,975,756 A | 12/1990 | Haken et al. ................ 357/4.1 |
| 4,998,151 A | 3/1991 | Korman et al. ............ 257/328 |
| 5,030,796 A | 7/1991 | Swanson et al. ........... 174/52.2 |
| 5,050,123 A | 9/1991 | Castro ........................ 365/53 |
| 5,061,978 A | 10/1991 | Mizutani et al. ............. 357/30 |
| 5,065,208 A | 11/1991 | Shah et al. .................. 357/34 |
| 5,068,697 A | 11/1991 | Noda et al. ................ 357/23.5 |
| 5,070,378 A | 12/1991 | Yamagata .................. 357/23.5 |
| 5,073,812 A | 12/1991 | Shimura ..................... 357/34 |
| 5,101,121 A | 3/1992 | Sourgen ..................... 307/465 |
| 5,117,276 A | 5/1992 | Thomas et al. ............... 357/71 |
| 5,121,089 A | 6/1992 | Larson et al. ............... 333/107 |
| 5,121,186 A | 6/1992 | Wong et al. ................ 257/384 |
| 5,132,571 A | 7/1992 | McCollum et al. ...... 307/465.1 |
| 5,138,197 A | 8/1992 | Kuwana ..................... 307/449 |
| 5,146,117 A | 9/1992 | Larson ...................... 307/465 |
| 5,168,340 A | 12/1992 | Nishimura ................. 357/376 |
| 5,177,589 A | 1/1993 | Kobayashi et al. ......... 257/773 |
| 5,202,591 A | 4/1993 | Walden ..................... 307/450 |
| 5,225,699 A | 7/1993 | Nakamura ................. 257/306 |
| 5,227,649 A | 7/1993 | Chapman ................... 257/204 |
| 5,231,299 A | 7/1993 | Ning et al. ................. 257/316 |
| 5,302,539 A | 4/1994 | Haken et al. ................ 437/41 |
| 5,308,682 A | 5/1994 | Morikawa .................. 428/195 |
| 5,309,015 A | 5/1994 | Kuwata et al. ............. 257/659 |
| 5,317,197 A | 5/1994 | Roberts ..................... 257/401 |
| 5,336,624 A | 8/1994 | Walden ....................... 437/34 |
| 5,341,013 A | 8/1994 | Koyanagi et al. ........... 257/368 |
| 5,345,105 A | 9/1994 | Sun et al. ................... 257/659 |
| 5,354,704 A | 10/1994 | Yang et al. ................... 437/52 |
| 5,369,299 A | 11/1994 | Byrne et al. ................ 257/638 |
| 5,371,390 A | 12/1994 | Mohsen ..................... 257/209 |
| 5,376,577 A | 12/1994 | Roberts et al. ............... 437/52 |
| 5,384,472 A | 1/1995 | Yin ............................ 257/204 |
| 5,384,475 A | 1/1995 | Yahata ....................... 257/314 |
| 5,399,441 A | 3/1995 | Bearinger et al. .......... 428/689 |
| 5,404,040 A | 4/1995 | Hshieh et al. .............. 257/341 |
| 5,412,237 A | 5/1995 | Komori et al. ............. 257/306 |
| 5,441,902 A | 8/1995 | Hsieh et al. ................. 437/34 |
| 5,468,990 A | 11/1995 | Daum ........................ 257/632 |
| 5,475,251 A | 12/1995 | Kuo et al. .................. 257/316 |
| 5,506,806 A | 4/1996 | Fukushima ................. 365/195 |
| 5,531,018 A | 7/1996 | Saia et al. ................... 29/622 |
| 5,539,224 A | 7/1996 | Ema ........................... 257/211 |
| 5,541,614 A | 7/1996 | Lam et al. ............... 343/792.5 |
| 5,571,735 A | 11/1996 | Mogami et al. ............. 437/41 |
| 5,576,988 A | 11/1996 | Kuo et al. ............. 365/185.04 |
| 5,611,940 A | 3/1997 | Zettler ..................... 73/514.16 |
| 5,638,946 A | 6/1997 | Zavracky ................... 200/181 |
| 5,677,557 A | 10/1997 | Wuu et al. .................. 257/382 |
| 5,679,595 A | 10/1997 | Chen et al. ................... 437/52 |
| 5,719,422 A | 2/1998 | Burr et al. .................. 257/336 |
| 5,719,430 A | 2/1998 | Goto .......................... 257/403 |
| 5,721,150 A | 2/1998 | Pasch ........................... 437/46 |
| 5,783,375 A | 7/1998 | Twist ......................... 430/414 |
| 5,783,846 A | 7/1998 | Baukus et al. ............. 257/204 |
| 5,821,590 A | 10/1998 | Lee et al. ................... 257/377 |
| 5,834,356 A | 11/1998 | Bothra et al. .............. 438/384 |
| 5,838,047 A | 11/1998 | Yamauchi et al. .......... 257/372 |
| 5,854,510 A | 12/1998 | Sur, Jr. et al. .............. 257/529 |
| 5,866,933 A | 2/1999 | Baukus et al. ............. 257/368 |
| 5,880,503 A | 3/1999 | Matsumoto et al. ........ 257/372 |
| 5,888,887 A | 3/1999 | Li et al. ..................... 438/525 |
| 5,895,241 A | 4/1999 | Lu et al. ..................... 438/275 |
| 5,920,097 A | 7/1999 | Horne ........................ 257/368 |
| 5,930,663 A | 7/1999 | Baukus et al. ............. 438/598 |
| 5,930,667 A | 7/1999 | Oda ........................... 438/622 |
| 5,973,375 A | 10/1999 | Baukus et al. |
| 5,977,593 A | 11/1999 | Hara .......................... 257/356 |
| 5,998,257 A | 12/1999 | Lane et al. ................. 438/253 |
| 6,037,627 A | 3/2000 | Kitamura et al. ........... 257/324 |
| 6,046,659 A | 4/2000 | Loo et al. ................... 333/262 |
| 6,054,659 A | 4/2000 | Lee et al. ................... 200/181 |
| 6,057,520 A | 5/2000 | Goodwin-Johansson .... 200/181 |
| 6,064,110 A | 5/2000 | Baukus et al. ............. 257/652 |
| 6,080,614 A | 6/2000 | Neilson et al. ............. 438/238 |
| 6,117,762 A | 9/2000 | Baukus et al. ............. 438/618 |
| 6,137,318 A | 10/2000 | Takaaki ...................... 326/112 |
| 6,153,484 A | 11/2000 | Donaton et al. ............ 438/301 |
| 6,154,388 A | 11/2000 | Oh ........................ 365/185.04 |
| 6,215,158 B1 | 4/2001 | Choi .......................... 257/368 |
| 6,261,912 B1 | 7/2001 | Hsiao et al. ................ 438/301 |
| 6,294,816 B1 | 9/2001 | Baukus et al. ............. 257/368 |
| 6,326,675 B1 | 12/2001 | Scott et al. ................. 257/608 |
| 6,503,787 B1 | 1/2003 | Choi .......................... 438/214 |
| 6,740,942 B2 | 5/2004 | Baukus et al. ............. 257/406 |

FOREIGN PATENT DOCUMENTS

| | | |
|---|---|---|
| EP | 0 463 373 | 1/1992 |
| EP | 0 528 302 A1 | 2/1993 |
| EP | 0 585 601 A1 | 3/1994 |
| EP | 0 764 985 A2 | 3/1997 |
| EP | 0 883 184 A2 | 12/1998 |
| EP | 0 920 057 A2 | 6/1999 |
| EP | 1 193 758 A1 | 4/2002 |
| EP | 1 202 353 A1 | 5/2002 |
| FR | 2486717 | 1/1982 |
| JP | 58-190064 | 11/1983 |
| JP | 61-147551 | 7/1986 |
| JP | 63-129647 A | 6/1988 |
| JP | 02-046762 | 2/1990 |
| JP | 02-188944 | 7/1990 |
| JP | 02-237038 | 9/1990 |
| JP | 10-256398 | 9/1998 |
| WO | 98/21734 | 5/1998 |
| WO | 98/57373 | 12/1998 |
| WO | 00/44012 | 7/2000 |

OTHER PUBLICATIONS

U.S. Appl. No. 10/132,523, filed Apr. 24, 2002, Clark, Jr. et al.

U.S. Appl. No. 10/637,848, filed Aug. 7, 2003, Chow et al.

U.S. Appl. No. 10/735,841, filed Dec. 12, 2003, Chow et al.

Blythe, et al., "Layout Reconstruction of Complex Silicon Chips," *IEEE Journal of Solid–State Circuits*, pp 138–145 (Feb. 1993).

Document No. 02237038, dated Dec. 6, 1990, Patent Abstracts of Japan, vol. 014, No. 550 (E–1009).

Document No. 63129647, dated Jun. 2, 1988, Patent Abstracts of Japan, vol. 012, No. 385 (E–668), Oct. 14, 1998.

Frederiksen, Thomas M., "Standard Circuits in the New CMOS Era," *Intuitive CMOS Electronics, Revised Edition*, pp. 134–146 (1989), no month cited.

Hodges and Jackson, *Analysis and Design of Digital Integrated Circuits*, 2nd edition, McGraw–Hill, p. 353 (1988), no month cited.

IBM_TDB, "Double Polysilicon Dynamic Memory Cell with Polysilicon Bit Line," pp 3828–3831 (Feb. 1979).

IBM_TDB, "Static Ram Double Polysilicon Process," pp 3683–3686 (Jan. 1981).

Larson, L.E., et al., "Microactuators for GaAs–based Microwave Integrated Circuits," *IEEE*, pp. 743–746 (1991), no month cited.

Lee, "Engineering a Device for Electron–beam Probing," *IEEE Design and Test of Computers*, pp. 36–49 (1989), no month cited.

Ng, Kwok K., *Complete Guide to Semiconductor Devices*, McGraw–Hill, Inc., pp. 164–165, (1995), no month cited.

Patent Abstracts of Japan, vol. 016, No. 197 (p–1350) May 12, 1992 & JP–A–40 28 092 (Toshiba Corp), abstract.

Sze, S.M., ed, *VLSI Technology*, McGraw–Hill, pp. 99, 447, and 461–465 (1983).

Sze, S.M., ed., "Silicides for Gates and Interconnections," *VLSI Technology*, McGraw–Hill, pp. 372–380 (1983), no month cited.

PERMANENTLY ON TRANSISTOR IMPLEMENTED USING A DOUBLE POLYSILICON LAYER CMOS PROCESS WITH BURIED CONTACT

CROSS-REFERENCE TO RELATED APPLICATIONS

This patent application is a divisional application of U.S. application Ser. No. 09/882,892, filed on Jun. 15, 2001, now U.S. Pat. No. 6,740,942.

This application may be related by subject matter to the following U.S. application(s): U.S. application Ser. No. 08/869,824, filed Jun. 6, 1997 (now U.S. Pat. No. 5,973,375); U.S. application Ser. No. 09/696,826, filed Oct. 25, 2000; U.S. application Ser. No. 10/132,523, filed Apr. 24, 2002; U.S. application Ser. No. 10/637,848, filed Aug. 7, 2003; U.S. application Ser. No. 10/735,841, filed Dec. 12, 2003; U.S. application Ser. No. 10/828,022, filed Apr. 19, 2004; U.S. application Ser. No. 10/881,286, filed Jun. 29, 2004; and U.S. application Ser. No. 09/758,792, filed Jan. 11, 2001.

BACKGROUND OF THE INVENTION

1. Field of the Invention

The present invention relates to the prevention and/or inhibition of reverse engineering of digital integrated circuits, and more particularly to covertly turning a transistor permanently ON via a double-polysilicon layer CMOS process with buried interconnects and to an integrated circuit structure comprising the same.

2. Description of the Related Art

The design, development and manufacturing efforts pertaining to semiconductor integrated circuits involve the understanding of complex structures, processes and manufacturing techniques involving smaller and smaller electronic circuitry. Efforts to be able to achieve such understanding and establish successful design, development and production manufacturing of such integrated circuits involve many man-hours of highly skilled professionals and considerable expense.

On the other hand, to avoid costly man-hours and other significant expenses some developers resort to reverse engineering practices wherein existing devices are taken apart, probed and otherwise examined to determine the physical structures of the resultant integrated circuit under review for subsequent copying. This reverse engineering, which typically relies primarily on obtaining planar optical image of the circuit, in essence attempts to by-pass typical product development efforts and expenses by studying and copying a competitive product.

Various approaches have been developed in an attempt to thwart such reverse engineering efforts, particularly in the field of semiconductor integrated circuits.

For example, U.S. Pat. No. 5,866,933 in the name of the same inventors of the present application teaches how transistors in a CMOS circuit can be connected by hidden lines between the transistors, via modifying the P+ and N+ source/drain masks. These implanted interconnections are further used to make a 3-input AND and OR circuit look substantially the same.

Moreover, U.S. Pat. No. 5,783,846 in the name of the same inventors of the present application teaches a further modification in the source/drain implant masks so that the implanted connecting lines between transistors have a gap inserted, the length of which is approximately the length of the feature size of the CMOS technology being used. If the gap is "filled" with one kind of implant (depending on the implanted connecting line being P or N) the line conducts. But, if the gap is filled with the other kind of implant the line does not conduct. These gaps are called "channel blocks". Thereby the reverse engineer must determine connectivity on the basis of resolving the n or p implant at the minimum feature size of the channel block. Moreover, transistor sizes and metal connection routings are modified, to eliminate keys by which the reverse engineer can find inputs, outputs, gate lines etc. as keys to the circuit functionality.

However, integrated circuits protected with the art taught and referenced above look different from standard integrated circuits produced with the same CMOS process. This gives the reverse engineer an indication that something in the circuit at hand is different.

SUMMARY OF THE INVENTION

Designing a circuit to appear as one function, but operate as another, is a good way to protect a circuit against reverse process engineering. The present invention applies to the following genre of CMOS fabrication processes.

The process according to the present invention employs at least two polysilicon layers. Such is the case in virtually all CMOS processes that manufacture DRAMs and EEPROMs. Moreover, the process according to the present invention makes use of a buried contact process.

The process according to the present invention provides selected transistors within the integrated circuit that are permanently ON despite the fact that they will look to the reverse engineer as normally functioning transistors.

In this way, the present invention overcomes the problems of the prior art by making use of a buried contact technique to make permanently turned-ON transistors in a double polysilicon CMOS process. In particular, as further disclosed in the present invention, both polysilicon layers can be deposited before source and drain implants.

A buried contact is a known structure in integrated circuit fabrication technology, firstly developed in the late 70's with nMOS circuits. A buried contact provides a direct connection between polysilicon, normally the gate of a MOS transistor, and the source/drain region of a MOS transistor. To create buried contacts, contact openings are masked and etched after gate oxide growth and before deposition and patterning of polysilicon. In this way the polysilicon over the source and/or drain regions can make direct contact to the source and/or drain regions by means of the buried contact openings. See for example S. M. Sze, VLSI Technology, McGraw-Hill, pages 461–478.

The present invention makes use of buried contacts to create permanently ON transistors that look identical to normal transistors. As a result, circuits can be designed to appear as performing one function but in fact perform another. Neither the ON transistors nor the other transistors require that polysilicon be deposited after source and drain implantation, as required by the prior art.

This also means that the present invention, which can be used with the art referenced above, or by itself, does not change the overall appearance of the integrated circuit. That is because the turning of the transistor permanently ON is accomplished in a covert manner.

According to a first aspect of the present invention, a permanently-ON MOS transistor is provided, comprising: a silicon source region of a first conductivity type; a silicon drain region of the first conductivity type; a silicon well region of a second conductivity type, in which said source region and drain region are buried; a silicon contact region of the first conductivity type, buried in the well region, said contact region contacting said source region and said drain region; a first gate insulating layer selectively placed over the silicon source region and the silicon drain region; a second gate insulating layer selectively placed over the first gate insulating layer and over the silicon contact region; and a polysilicon gate region placed over the second gate insulating layer.

According to a second aspect of the present invention, an integrated circuit structure for MOS-type devices is provided, comprising at least one permanently-ON MOS transistor, said transistor including: a first silicon source region of a first conductivity type; a first silicon drain region of the first conductivity type; a first silicon well region of a second conductivity type, in which the first silicon source region and the first silicon drain region are buried; a silicon contact region of the first conductivity type, buried in the well region, the contact region contacting the silicon source region and the silicon drain region; a first gate insulating layer selectively placed over the silicon source region and the silicon drain region; a second gate insulating layer selectively placed over the first gate insulating layer and over the silicon contact region; and a first polysilicon gate region placed over the second gate insulating layer.

According to a third aspect of the present invention, a process is provided for forming a permanently-ON MOS transistor comprising the steps of: providing a silicon well region of a first conductivity type; depositing a first insulating layer over the silicon well region of the first conductivity type; removing a portion of said deposited first insulating layer; forming a buried silicon region of a second conductivity type within the silicon well region of the first conductivity type, under the removed portion of said deposited first insulating layer; depositing a second insulating layer over the first insulating layer and over the buried silicon region of the second conductivity type; forming a polysilicon gate region over the second insulating layer; and forming a source region of the second conductivity type and a drain region of the second conductivity type within the buried silicon well region, said source region and drain region contacting said buried silicon region of the second conductivity type.

BRIEF DESCRIPTION OF THE DRAWINGS

The present invention will be understood and appreciated more fully from the following detailed description taken in conjunction with the drawings, in which.

DETAILED DESCRIPTION OF THE INVENTION

Reference will be now made to the drawings that are shown for the purpose of describing the preferred embodiment of the invention and not for limiting same.

In the following FIGS. 1 to 3 the N-type buried contacts are shown, i.e. a P-well silicon region having N+ type buried contact implants and N+ type source/drain active regions. Similarly, P-type buried connections will require P+ type source/drain connections and P+ type buried contact implants.

In a double polysilicon CMOS process with buried contact, the buried contact is usually opened with masking and doped with the appropriate (i.e. N+ or P+ depending on the type of transistor) implant after the first gate oxide growth. A first layer of polysilicon is deposited to make connection to the source and drain area in the buried contact. The first layer of polysilicon can also be used to form the gate of the transistor with the first gate oxide.

In an EEPROM circuit, the first layer of polysilicon is used as the floating gate for the memory and functions as the bottom plate of a capacitor formed between the first layer and the second layer of polysilicon. The second layer of polysilicon is therefore the upper plate of a capacitor and is used as the gate of the transistor over a gate oxide having a thickness which is the sum of the thicknesses of the first and of the second oxide.

Polysilicon has long been used to form the gates for MOS transistors (see for example S. M. Sze, Op. Cit., page 99) and this requires a CMOS process having one level of deposited polysilicon. CMOS processes employing two polysilicon layers, the two layers typically being separated by an oxide layer, make possible the formation of capacitors and electrically erasable programmable read only memories (EEPROM), see Hodges and Jackson, Analysis and Design of Digital Integrated Circuits, 2nd edition, McGraw-Hill, 1998, page 353.

Figure 1:
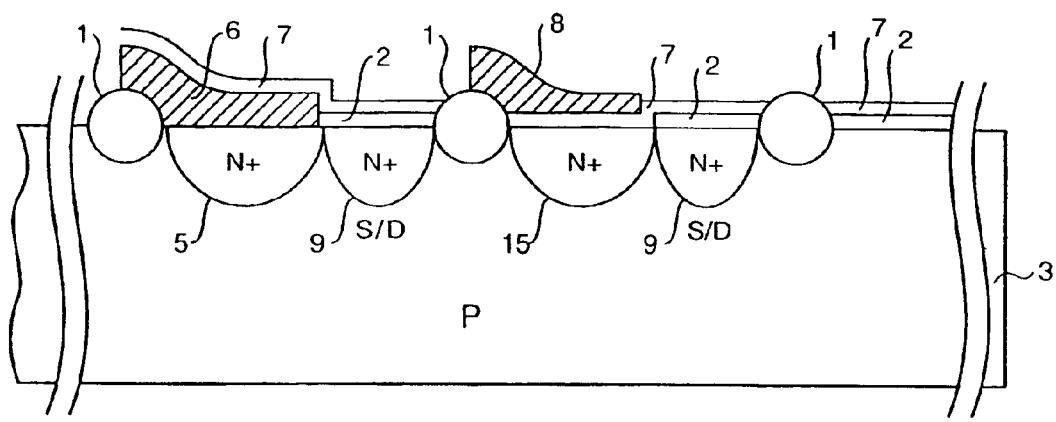
FIG. 1 is a cross section of a circuit structure showing buried contacts in which the present invention can be realized.

FIG. 1 shows the cross section of the P-well portion of a CMOS integrated circuit in which a buried contact structure is shown, both where contact is made (left side of FIG. 1) and where contact is not made (right side of FIG. 1). Field insulating regions of the CMOS integrated circuit, for example field oxide regions, are indicated by numeral 1, while first gate insulating regions, for example first gate oxide regions, are indicated by the numeral 2. Numeral 3 indicates a silicon well region of a first conductivity type, in this embodiment a P-well region. The field oxide shown here can be, for example, conventional LOCOS (LOCal Oxidation of Silicon) oxide. Buried regions 5, 15 of a second conductivity type, in this embodiment N+ regions, are implanted in the P well 3. The buried region 5 is contacted by a first polysilicon layer 6. A second gate oxide 7, having a preferred thickness of about 100 Å to 200 Å, is disposed in part over the first polysilicon layer 6, in part over the first gate insulator 2 and in part over buried N+ regions like the buried N+ regions 15.

In general, the first and the second layer gate oxide are not deposited over the LOCOS regions 1. However, embodiments in which this occurs could also be possible.

A second polysilicon layer 8 is placed over the N+ region 15, isolated therefrom by means of the second gate oxide 7. Finally, buried source/drain (S/D) regions 9 are present, formed, for example, through ion implantation. It should be noted that the first polysilicon layer 6 makes contact to the N+ region 5 and is connected to the source/drain regions 9 through such region 5. On the contrary, the second polysilicon layer 8, though it also has buried contact opening and implant, is isolated from the N+ region 15 by means of the second gate oxide 7. Moreover, all the S/D regions 9 can be implanted after deposition of the polysilicon layers 6, 8.

Thus, the left part of FIG. 1 shows a conventional buried contact (i.e. the N+ region 5 contacts the first polysilicon layer 6), while the right part of FIG. 1 shows a buried contact 15 (separated from the second polysilicon layer 8 by a gate oxide 7) which can be used in order to realize a permanently ON transistor as shown in the following figures.

In accordance with the preferred embodiment of the present invention, a permanently ON transistor is implemented in a double polysilicon layer CMOS integrated circuit like the one described in FIG. 1. As it will be appreciated by the person skilled in the art, the permanently ON transistor can be implemented in NMOS and PMOS structures as well.

Figure 2:
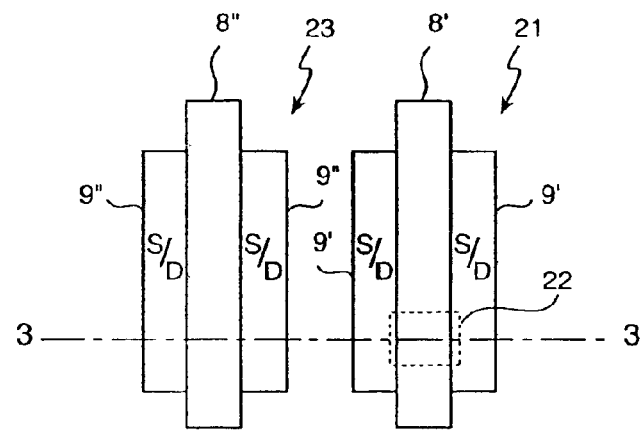
FIG. 2 is a top plan view of two MOS transistors, one of which is turned on according to the present invention.

FIG. 2 shows a top plan view of two transistors, wherein transistor 21 is a permanently-ON transistor realized according to the present invention and transistor 23 is a normal transistor. Transistor 21 has a polysilicon gate 8' and source/drain regions 9', together with a buried contact opening 22. Transistor 23 has a polysilicon gate 8" and source/drain regions 9", with no buried contact openings. Of course, the buried contact opening 22 is shown for clarity purposes only and it is invisible when viewing the circuit from the top. Therefore, transistor 21 is identical to transistor 23 when viewed from the top.

Figure 3:
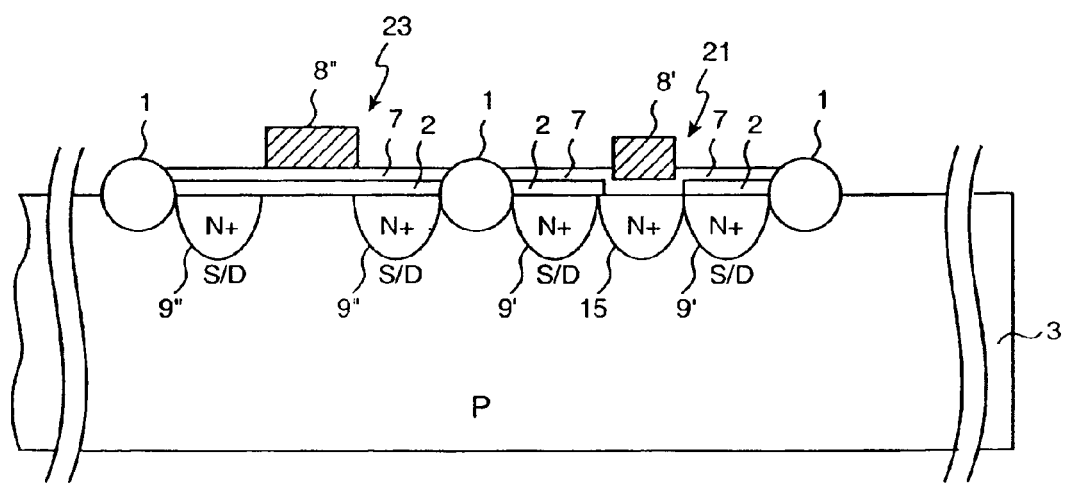
FIG. 3 is a cross section taken along line A—A of FIG. 2.

FIG. 3 is a cross section taken along line 3—3 of FIG. 2. With reference to the source/drain regions 9' of transistor 21, it should be noted that they are short-circuited by the implanted N+ region 15. The result of this is that transistor 21 is turned ON permanently. Because of the buried contact being located at the channel region, the etching process of the buried contact opening only created a step of the thickness of the second gate oxide 7, around 100 Å to 200 Å thick. This step is very difficult to identify during a reverse engineering process and makes the permanently ON transistor 21 very difficult to detect and to distinguish from a non-permanently ON transistor like transistor 23.

Figure 4:
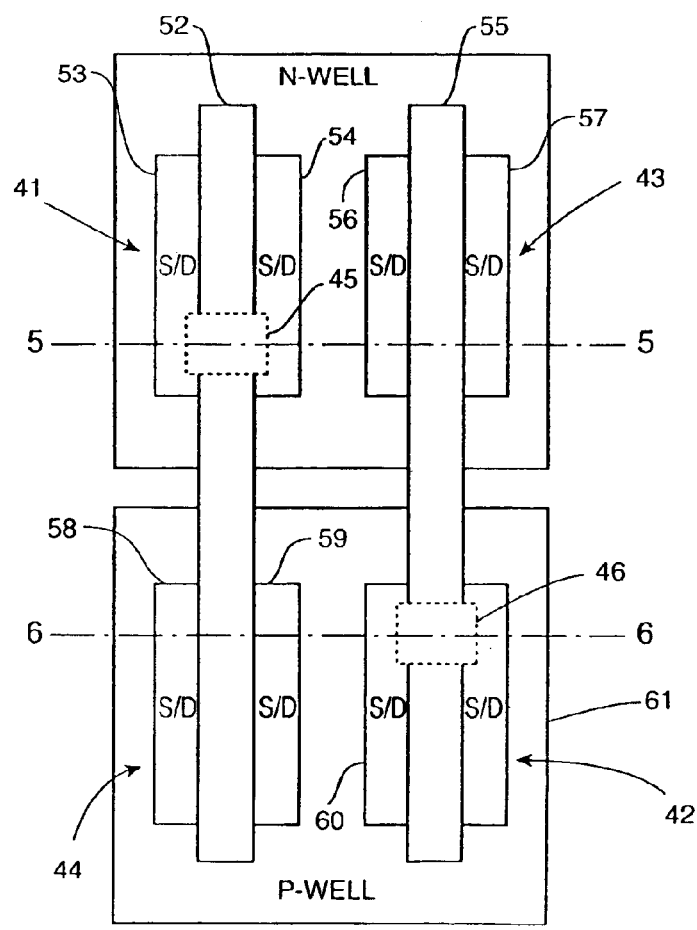
FIG. 4 is a top plan view of four MOS transistors in a CMOS configuration, two of which are turned on according to the present invention.

FIG. 4 is a top plan view of four MOS transistors in a CMOS configuration, two of which are turned on according to the present invention. Transistors 41 and 42 are permanently-ON transistors realized according to the present invention and transistors 43 and 44 are normal transistors. Transistor 41 has a buried contact opening 45 and transistor 42 has a buried contact opening 46. Again, the buried contact openings are shown for clarity purposes only and are invisible when viewing the circuit from the top.

Figure 5:
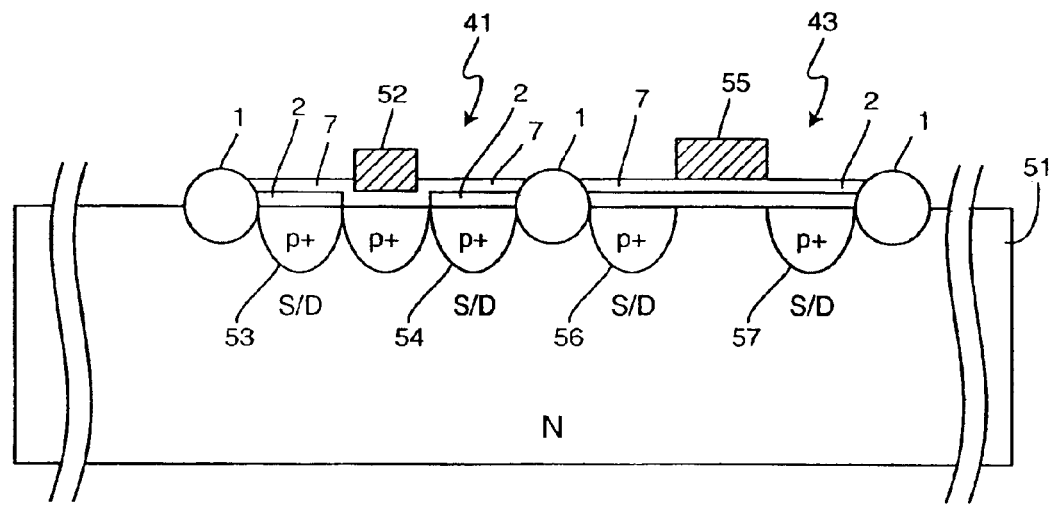
FIG. 5 is a cross section taken along line B—B of FIG. 4.
Figure 6:
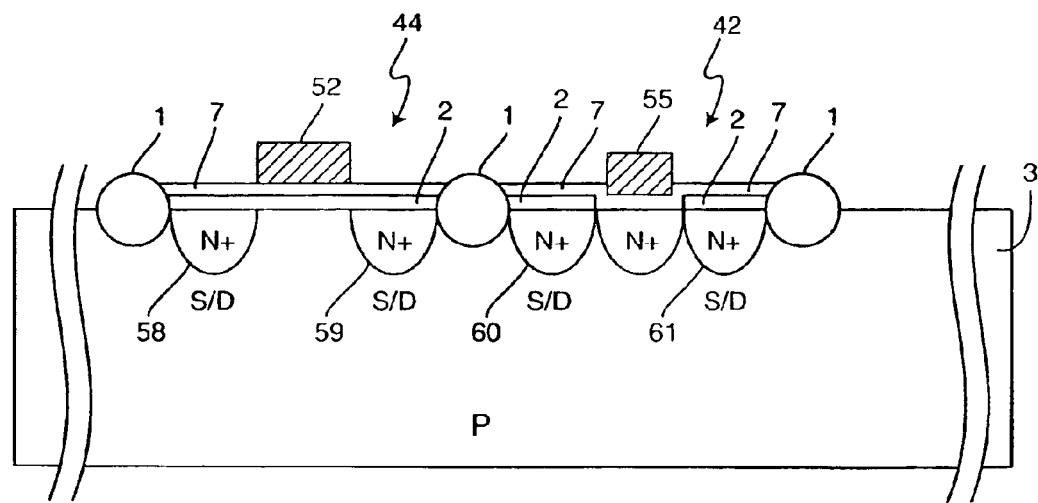
FIG. 6 is a cross section taken along line C—C of FIG. 4.

FIGS. 5 and 6 are cross sections taken along lines 5—5 and 6—6 of FIG. 4 respectively. The description of those figures is similar to the description of FIG. 3.

The invention has been described with reference to a particular embodiment. Modifications and alterations will occur to others upon reading and understanding this specification. It is intended that all such modifications and alterations are included insofar as they come within the scope of the appended claims or equivalents thereof.

What is claimed is:

1. A process for forming a permanently-ON MOS transistor comprising the steps of:

providing a silicon well region of a first conductivity type;

depositing a first insulating layer over the silicon well region of the first conductivity type;

removing a portion of said deposited first insulating layer;

forming a buried silicon region of a second conductivity type within the silicon well region of the first conductivity type, under the removed portion of said deposited first insulating layer;

depositing a second insulating layer over the first insulating layer and over the buried silicon region of the second conductivity type;

forming a polysilicon gate region over the second insulating layer; and forming a source region of the second conductivity type and a drain region of the second conductivity type within the buried silicon well region, said source region and drain region contacting said buried silicon region of the second conductivity type.

2. The process according to claim 1, wherein said step of forming a source region of the second conductivity type and a drain region of the second conductivity type within the buried silicon well region is the last step of the process among the steps of claim 1.

3. The process of claim 1, wherein said first conductivity type is a P conductivity type and said second conductivity type is a N conductivity type.

4. The process of claim 1, wherein said first conductivity type is a N conductivity type and said first conductivity type is a P conductivity type.

5. The process of claim 1, wherein said first gate insulating layer is a first gate oxide layer and said second gate insulating layer is a second gate oxide layer.

6. The process of claim 1, wherein said permanently ON transistor makes part of an EEPROM circuit.

* * * * *